United States Patent [19]
Kajiwara et al.

[11] Patent Number: 5,994,890
[45] Date of Patent: Nov. 30, 1999

[54] HARMONICS SURVEY SYSTEM

[75] Inventors: Yoshihiro Kajiwara, Saga-ken; Takeru Aishima, Saga, both of Japan

[73] Assignee: Togami Electric Mfg. Co., Ltd., Japan

[21] Appl. No.: 08/963,973

[22] Filed: Nov. 4, 1997

[30] Foreign Application Priority Data

Nov. 10, 1996 [JP] Japan .................................. P8-314267

[51] Int. Cl.[6] .................................................. G01R 21/06
[52] U.S. Cl. ........................ 324/76.21; 324/520; 324/529; 324/623
[58] Field of Search ............................. 324/76.21, 76.22, 324/623, 520

[56] References Cited

U.S. PATENT DOCUMENTS

| 5,170,114 | 12/1992 | Lowenstein | 324/623 |
| 5,347,464 | 9/1994 | McEachern | 324/520 |
| 5,365,164 | 11/1994 | Lowenstein | 324/520 |
| 5,754,440 | 5/1998 | Cox | 324/76.21 |

FOREIGN PATENT DOCUMENTS 61-199420 9/1986 Japan .

*Primary Examiner*—Josie Ballato
*Assistant Examiner*—Jose M. Solis
*Attorney, Agent, or Firm*—Rader, Fishman & Grauer; Ronald P. Kananen

[57] ABSTRACT

A harmonics survey system includes an induction coil arranged so as to cross over a magnetic flux generated by a current passing a distribution line to be surveyed and adapted to detect a detection current caused by an electro motive force in proportion to the current passing the distribution line, a harmonics detection unit operatively connected to the induction coil and adapted to detect a fundamental component and a harmonic component of the detection current detected by the induction coil, a harmonic current content operation unit for operating the harmonic current content of the harmonic component with respect to the fundamental component detected by the harmonic detection unit, and an indication unit for indicating the harmonic current content operated by the harmonic current operation unit.

9 Claims, 5 Drawing Sheets

PRIOR ART

PRIOR ART

HARMONICS SURVEY SYSTEM

BACKGROUND OF THE INVENTION

The present invention relates to a harmonics survey system for surveying harmonics superimposed to a power transmission (distribution) line particularly capable of surveying the harmonics in an optional power transmission line in a non-contact manner.

In a known art, there is provided a system, as such harmonic survey system, for surveying harmonics in accordance with a detected result of a current sensor such as shown in FIG. 4 as a schematic block diagram of a known harmonics survey system.

In the harmonics survey system of FIG. 4, a current transformer CT for an instrument is disposed to a distribution line 100 of a receive-side transformer 300, and harmonics superimposed to the distribution line 100 is detected by a harmonics detection circuit 120 in accordance with a value detected by the current transformer CT. The harmonics detection circuit 120 is adapted to operate and then detect current values of respective degrees or orders of the harmonics, and concrete current values corresponding to the harmonics of the respective degrees are displayed by a display section.

The harmonics detection circuit 120 can detect the harmonic through a fast Fourier transform process. In such case, in a primary stage of the fast Fourier transform process, the current detected by the current transformer CT is sampled with a predetermined sampling frequency to thereby convert the current to a digital signal.

Further, another system for preventing a harmonic fault is also disclosed in Japanese Patent Laid-open (KOKAI) Publication No. SHO 61-199420, which will be shown in FIG. 5.

With reference to FIG. 5, the condenser system as a conventional harmonics survey system is provided with condensers C1, C2 and C3 and linear reactors L1, L2 and L3 connected in series to the condensers C1, C2 and C3, respectively, and also provided with induction coils L10, L20 and L30 magnetically coupled with the linear reactors L1, L2 and L3, respectively. These induction coils L10, L20 and L30 have output ends to which outputs from harmonics detection circuits 121, 122 and 123 composed of synchronizing circuits synchronized with the coils to be detected are applied as harmonics detection signals. The condensers C1, C2 and C3 are also connected with branch lines 110R, 110S and 110T branched from distribution lines 100R, 100S and 100T of a power supply system, respectively, thus constituting the series circuits together with the condensers C1, C2 and C3 and the linear reactors L1, L2 and L3. A breaker 10 is interposed between the branch lines 110R, 110S and 110T and the distribution lines 100R, 100S and 100T so as to establish an electrical connection therebetween and separate them from each other.

The harmonics detection circuits 121, 122 and 123 connected to the output ends of the induction coils L10, L20 and L30 magnetically coupled with main coils of the linear reactors L1, L2 and L3 are composed of tuning (synchronizing) circuits having tuning characteristics having detection objects of harmonic orders such as fifth harmonics or seventh harmonics, and outputs generated upon the detection of such harmonics are utilized as harmonics detection signals. An alarm 130 operated in response to the harmonics detection signal serves to separate the breaker 110 in response to an alarming operation. A buzzer, lamp or other display means may be utilized in substitution for the alarm 130 or in combination therewith. Further, the harmonics detection circuits 121, 122 and 123 may be accommodated in a container or disposed outside thereof.

In general, electric current flowing the main circuits of the linear reactors L1, L2 and L3 of the characters mentioned above has a linearly proportional relationship to intensity of a leakage magnetic field, and accordingly, voltages proportional to the harmonic current flowing the main coils are outputted to the induction coils L10, L20 and L30 magnetically coupled with the main circuits of the linear reactors L1, L2 and L3 through the leakage magnetic field.

When the harmonic current of the detection objective order flows to the linear reactors L1, L2 and L3, the induction coils L10, L20 and L30 generate voltages in proportion to the harmonic current, and these voltages are detected by the harmonics detection circuits 121, 122 and 123 to thereby generate the harmonics detection signals. In response to these signals, since the alarm 130 is operated, it is known that the harmonic current flows into the condensers C1, C2 and C3 as condenser system. In response to the operation of the alarm 130, the breaker 110 is separated or this fact may be displayed on a display means.

The harmonics detection circuits 121, 122 and 123 may have small energization power even if it serves to energize only the alarm 130, and accordingly, the induction coils L10, L20 and L30 having small capacities may be also utilized, so that no influence is applied to magnetic fluxes caused by the linear reactors L1, L2 and L3.

As mentioned above, according to the conventional harmonics survey system, there can be surveyed only the fact whether the harmonics at portions of the distribution lines 100, 100R, 100S and 100T, to which the current transformer CT for an instrument or induction coils L10, L20 and L30 are connected, are superimposed or not, and it is impossible to survey the existence (presence) of the harmonics at the other portions of these distribution lines to which current transformer CT or induction coils are not connected, providing a problem.

Furthermore, in the conventional harmonics survey system, since the current values are obtained and displayed every time of the respective orders of the harmonics, it is required to consider influences to respective equipments or elements every time of the respective orders, also providing a problem of difficulty in the total judgement. Concretely, even in a case where the current values of the harmonics of the respective orders are within ranges of preset allowable values, when the harmonics of the respective orders totally act, significant influence will be given to, for example, a high pressure phase advance condenser or linear reactor, resulting in an occurrence of harmonic fault.

Further, in any conventional harmonics survey system mentioned above, in order to survey the harmonics at optional portions other than the specified or predetermined portions of the distribution lines 100, 100R, 100S and 100T, it is necessary to survey the harmonics through direct or indirect contact to the distribution lines, thus being dangerous for workers particularly in a case of high voltage current.

SUMMARY OF THE INVENTION

An object of the present invention is to substantially eliminate defects or drawbacks encountered in the prior art described above and to provide a harmonics survey system capable of safely and totally surveying harmonics at every optional portion of a distribution line without directly contacting the same.

This and other objects can be achieved according to the present invention by providing a harmonics survey system comprising:

an induction coil means arranged so as to cross over a magnetic flux generated by a current passing a distribution line and adapted to detect a detection current caused by an electro motive force in proportion to the current passing the distribution line;

a harmonics detection means operatively connected to the induction coil means and adapted to detect a fundamental component and a harmonic component of the detection current detected by the induction coil means;

means for operating a harmonic current content of the harmonic component with respect to the fundamental component detected by the harmonics detection means; and means for indicating the harmonic current content operated by the harmonic current operation means.

In preferred embodiments, the harmonics detection means comprises a current amplifier operatively connected to the induction coil means and further comprising an A/D converter connected to the current amplifier for converting analog value representing the amplified current into digital value thereof and a fast Fourier transforming means operatively connected to the A/D converter and adapted to carry out a fast Fourier transforming process to the detected digital current and operate the fundamental component and the harmonic component of the detected current.

The indication means comprises at least either one of a display unit and an alarm unit.

There may comprise means for operating a total harmonic distortion of current (called hereinafter merely THD) in accordance with the detection currents of the fundamental component and the harmonic component, respectively, the indication means informing the THD operated by the THD operation means and also comprise a detection current correction means disposed between the harmonics detection means and the THD operation means and adapted to correct, in every order of the harmonics, the fundamental component and the harmonic component the detection current detected by the harmonics detection means and to output the corrected detection current to at least either one of the harmonic current content operation means and the THD operation means.

The indication means comprises a display unit visually displaying at least either one of the harmonic current content, numerical values of respective orders of the harmonics to be detected and the THD. A control means including a switch unit capable of optionally changing over the displayed contents may be further arranged.

In further preferred embodiments, the induction coil means includes a directivity adjusting unit for changing directivity in a range crossing over the magnetic flux generated by the current passing the distribution line and also includes a sensitivity adjusting unit for adjusting and then outputting a detection sensitivity of the current detected by the induction coil means or a current level thereof.

The induction coil means is disposed to a free end of a support rod having an expandable telescopic structure and such support rod may be mounted to a casing in which the respective means or elements mentioned above are accommodated or mounted.

According to the structures and characteristic features of the present invention mentioned above, in general aspect, the induction coil crosses over the magnetic flux caused by the distribution line to be surveyed in harmonics, the fundamental component and the harmonic component of the current detected by the detection means, the content of the harmonic component of the detected harmonics with respect to that of the fundamental component is operated by the harmonic current content operation means and the thus operated harmonic current content is indicated through the indication means. Accordingly, it is possible to totally judge the existence of the harmonics with the maximum current allowable to the harmonic currents without directly contacting the distribution line to be surveyed and thereby to safely and totally survey the harmonics at every portion of the distribution line.

Furthermore, according to various preferred embodiments, since the THD is operated in accordance with the detection currents of the fundamental component and the harmonic component by the THD operation means and the operated THD is then indicated through the indication means, the magnitudes of the harmonics in every order passing the distribution line can be totally judged.

Since either one of the harmonic content, the numerical values of the respective orders of the harmonics or the harmonic current distortion is displayed on the display unit selectively by the operation of the switch means provided for the control unit, the condition of the harmonic currents superimposed to the distribution line can be displayed precisely and clearly for the operator.

Since the detection current correction means corrects the detection currents of the fundamental component and the harmonic component in every order thereof, it becomes possible to make, the different detection currents in every order of the harmonics generated through the detection by the induction coil, operatively coincident with the harmonic current passing the distribution line, thus safely and precisely detecting the harmonic current without contacting the distribution line.

Still furthermore, since the directivity adjusting means adjusts the directivity of the induction coil, the harmonics survey can be performed by selectively specifying the distribution line to be surveyed to thereby further precisely survey the distribution line through which the harmonic current passes. Since the sensitivity adjusting unit adjusts and then outputs the detection sensitivity of the current detected by the induction coil or adjusts the current level thereof, it becomes possible to change the harmonics surveying range by adjusting the detection sensitivity of the induction coil or the outputting detection current level from the induction coil, thus being capable of easily and precisely specifying the harmonics generating source.

The location of the induction coil to the front end of the expandable support rod makes it possible to optionally position the induction coil with a distance from the distribution line to be surveyed to thereby further precisely specify the generation source of the harmonics.

The nature and further features of the present invention will be made more clear from the following descriptions by way of preferred embodiments with reference to the accompanying drawings.

DESCRIPTION OF THE PREFERRED EMBODIMENTS

First Embodiment

The first embodiment of the harmonics survey system according to the present invention will be described hereunder with reference to FIG. 1.

Figure 1:
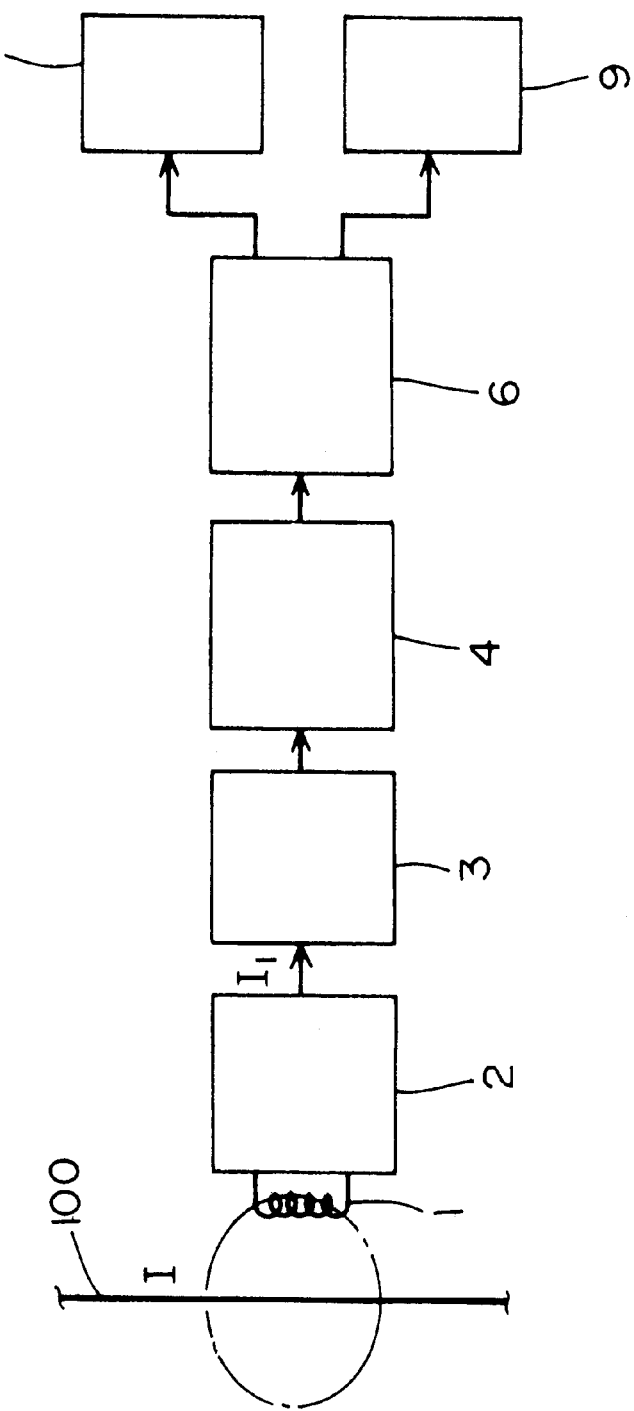
FIG. 1 is a block circuit diagram of a harmonics survey system according to a first embodiment of the present invention.

Referring to FIG. 1, the harmonics survey system of this first embodiment comprises: an induction coil 1 arranged so as to cross over a magnetic flux generated by a current flowing a distribution line 100 as an object having harmonics to be surveyed and adapted to detect a current generated by an electro motive force induced by the flux; a current amplifier 2 amplifying the detection current with a predetermined amplification factor and removing a frequency component higher than a predetermined frequency with an anti-aliasing filtering function; an A/D converter 3 for converting an analog value of the amplified detection current to a digital value; a fast Fourier transforming unit 4 for carrying out a fast Fourier transforming processing to the detection current of the digital value and adapted to operate fundamental component and harmonic component; a harmonic current content operation unit 6 for operating a content (containing ratio) of the operated harmonic component with respect to the operated fundamental component; a display unit 8 displaying the content of the current of the thus operated harmonic component; and an alarm unit 9 for generating an alarm in a case where the content of the harmonic current exceeds the predetermined value.

A harmonics surveying processes of the harmonics survey system of the structure described above will operate as follows.

First, the induction coil 1 is brought near to the distribution line 100 through which it is assumed that a harmonic current flows so as to cross over the magnetic flux generated by the current I flowing the distribution line 100. A detection current I1 is caused to the induction coil 1 due to the cross-over of the induction coil 1 to the magnetic flux, and the detection current I1 has a distortion characteristic corresponding to the current I flowing the distribution line 100. That is, the detection current I1 differs from the current I in their values (I1≠I1), but the ratios of the current of the fundamental component and that of the current of the harmonic component have the same values.

An analog value of the detection current I1 thus detected by the induction coil 1 is then converted to a digital value through the A/D converter 3, and thereafter, the fast Fourier transforming unit 4 carries out the fast Fourier transforming processing in accordance with the detection signal of digital value to thereby operate the respective components of the fundamental current and the harmonic current. Next, in accordance with the fundamental current and the harmonic current, the harmonic current content operation unit 6 operates the harmonic current content as a ratio of a n-th harmonics with respect to the effective value of the fundamental component. The thus obtained harmonic current content ratio or percentage is displayed by the display unit 8 as a digital value, and in a case where this digital value exceeds the predetermined value, the alarm unit 9 generates an alarm such as buzzer noise to inform an operator of this fact. The magnitude of the alarm noise may be changed in accordance with the largeness of the harmonic current content. Further, the numerical value of the harmonic current content of the predetermined value as a reference of the alarm unit 9 may be optionally set.

Second Embodiment

Figure 2:
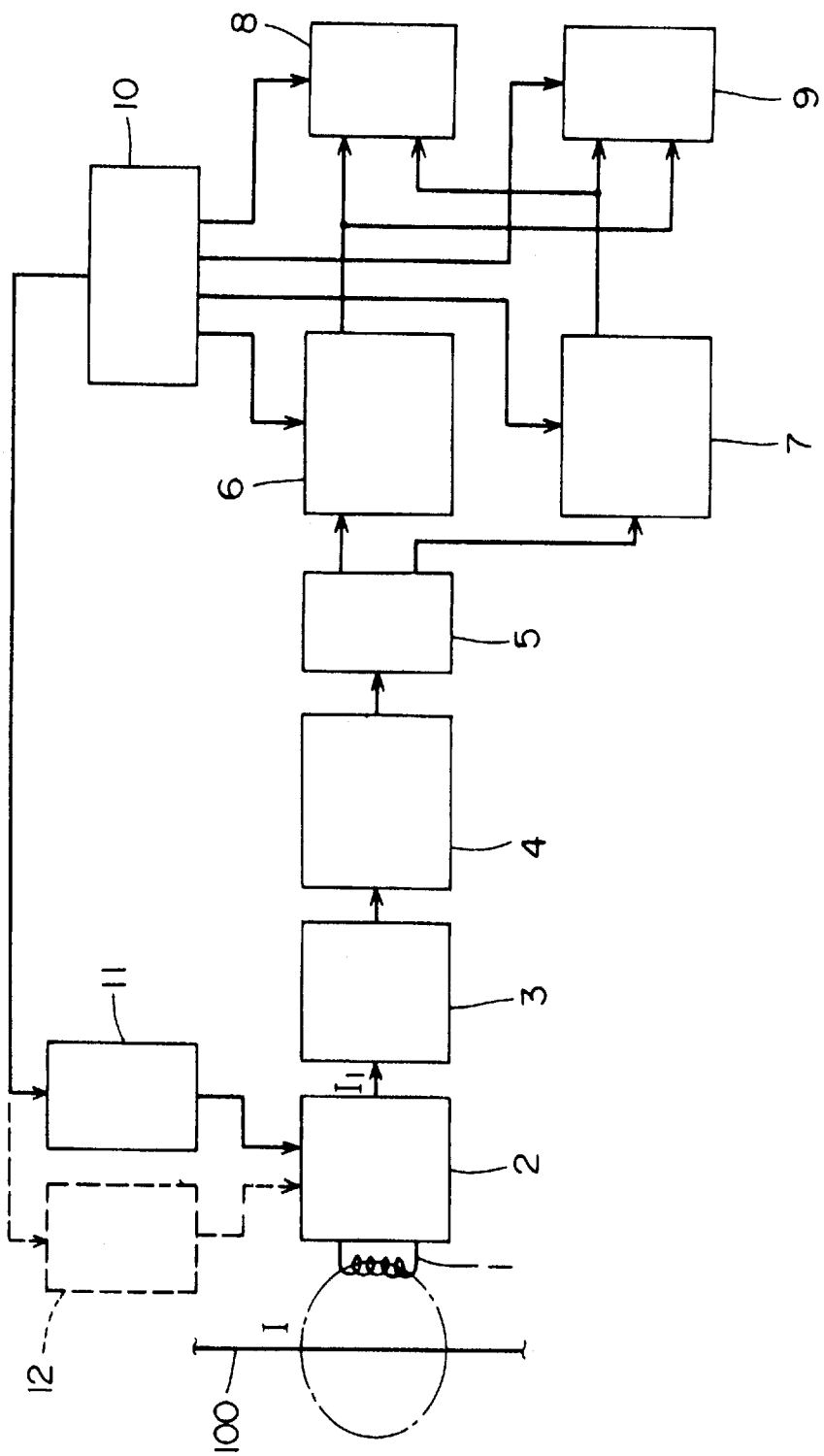
FIG. 2 is a block circuit diagram of a harmonics survey system according to a second embodiment of the present invention.
Figure 3:
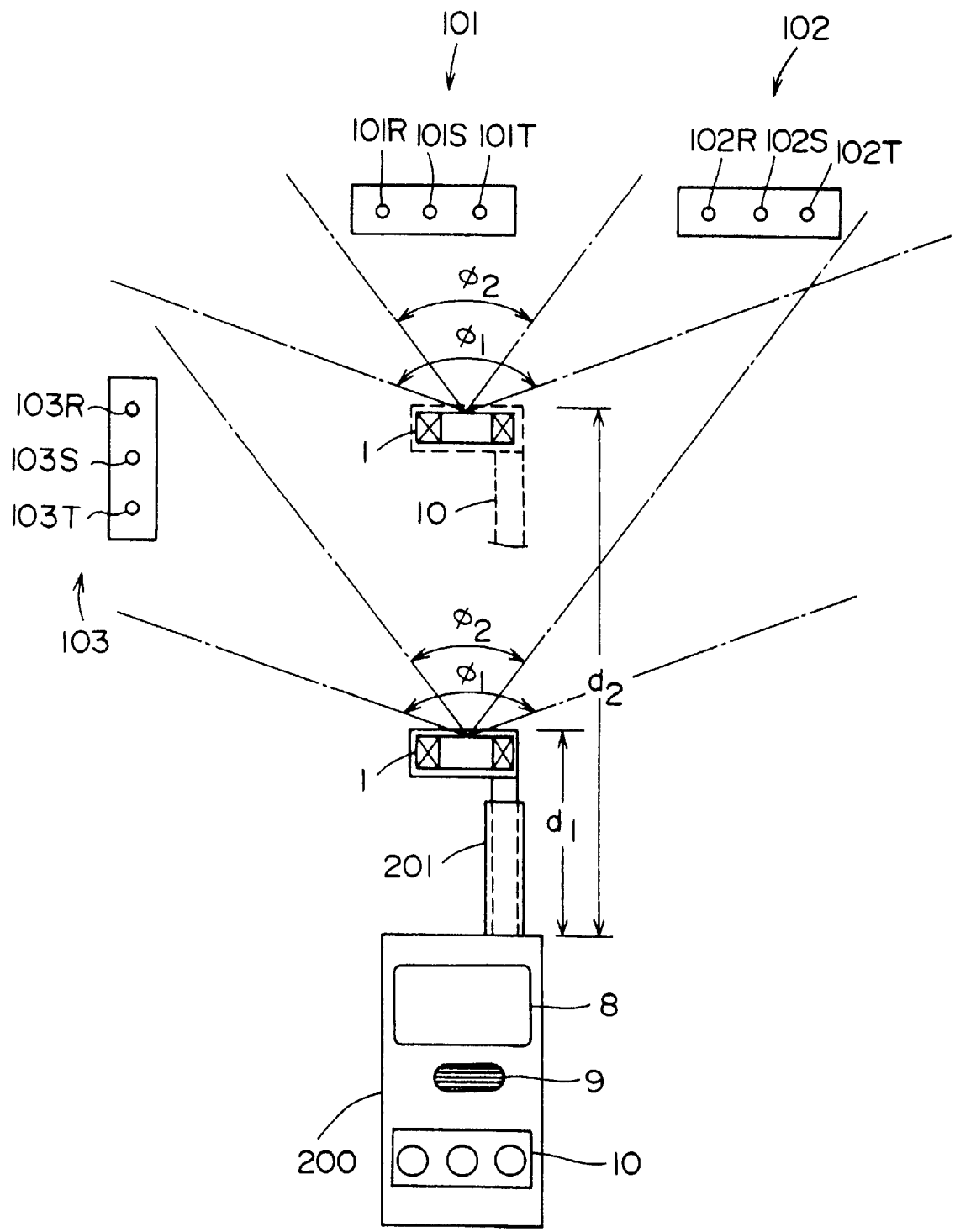
FIG. 3 is a view showing a surveying condition by using the harmonics survey system of FIG. 2.
Figure 4:
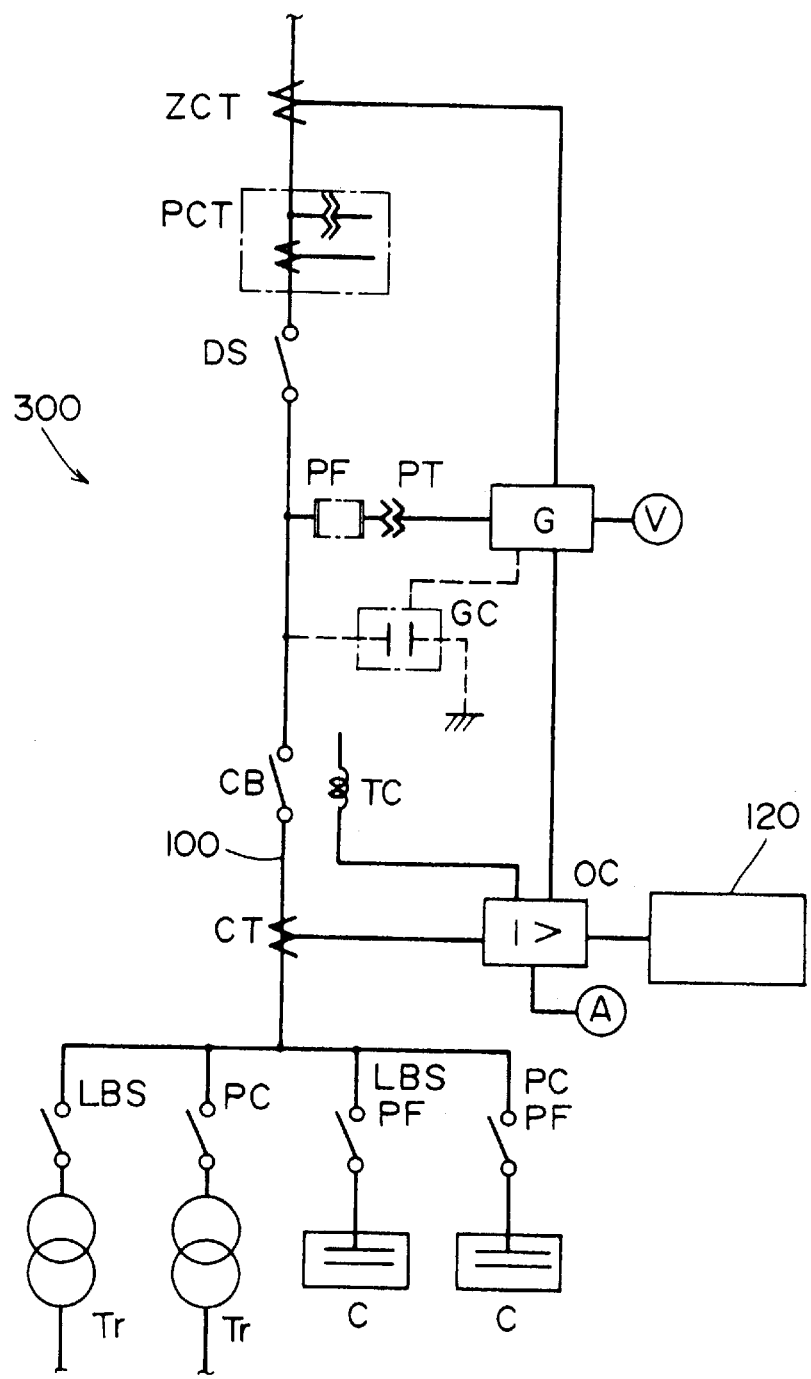
FIG. 4 is a block diagram schematically showing one conventional harmonics survey system.
Figure 5:
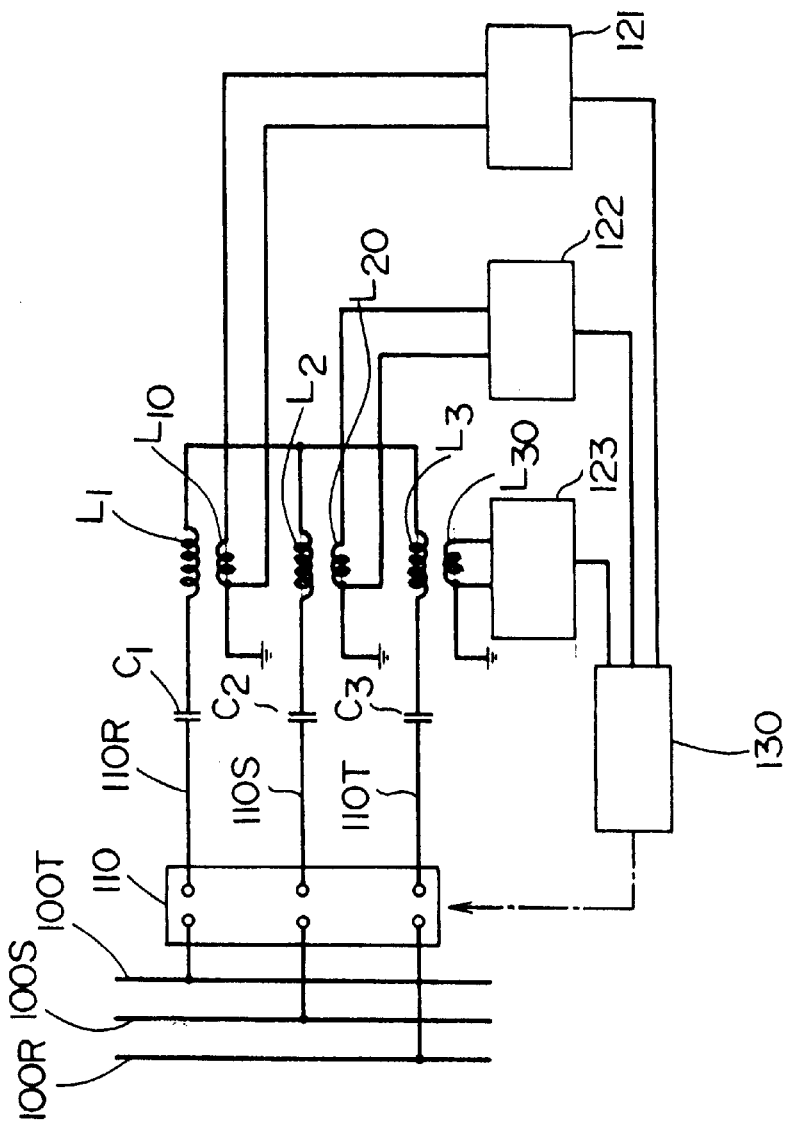
FIG. 5 is a block diagram preventing a harmonics fault in another conventional harmonics survey system.

The second embodiment of the harmonics survey system according to the present invention will be next described hereunder with reference to FIGS. 2 and 3.

With reference to FIGS. 2 and 3, the harmonics survey system of the second embodiment commonly comprises, as in the first embodiment shown in FIG. 1, the induction coil 1, the current amplifier 2, the A/D converter 3, the fast Fourier transforming unit 4, the harmonic current content operation unit 6, the display unit 8 and the alarm unit 9. The harmonics survey system of the second embodiment further comprises, in addition to the above elements and units, a harmonics correction unit 5 connected between the fast Fourier transforming unit 4 and the harmonic current content operating unit 6 and adapted to correct the current values of the respective orders of the harmonics and to output the corrected detection current, a unit 7 for operating a total harmonic distortion of current (called hereinafter merely THD operation unit 7) adapted to operate the THD of the thus corrected detection current, a directivity adjusting unit 11 adapted to change and adjust the directivity of the induction coil 1 with respect to the cross-over flux and a control unit 10 adapted to input operational instructions of the operator to the respective units or elements mentioned above.

The current amplifier 2, the A/D converter 3, the fast Fourier transforming unit 4, the harmonics correction unit 5, the harmonic current content operation unit 6, the THD operation unit 7 and the directivity adjusting unit 11 are all accommodated in a casing 200, and the display unit 8, the alarm unit 9 and the control unit 10 are mounted on the front surface side of the casing 200. A support rod 201 having an expandable telescopic structure is mounted to the casing so as to extend outward, and the induction coil 1 is arranged to the distal front end portion of the support rod 201. The fast Fourier transforming unit 4, the harmonics correction unit 5, the harmonic current content operation unit 6 and the THD operation unit 7 may be constructed by a single or a plurality of micro-computers or operation chips.

The harmonics survey system according to the second embodiment of the present invention of the arrangement described above will be operated as follows.

As like in the first embodiment represented by FIG. 1, the induction coil 1 is crossed over the magnetic flux of the distribution line 100 to be surveyed, and the detection current I1 caused to the induction coil 1 is amplified to a predetermined value by the current amplifier 2 and the frequency component higher than the predetermined frequency is removed with the anti-aliasing filtering function. Thereafter, the A/D converter 3 serves to convert this current value to a digital value. Next, in the fast Fourier transforming unit 4 performs the fast Fourier transforming processing to the detection current I1 of the digital value to thereby calculate the current values of both the fundamental component and harmonic component.

Then, the current of the thus calculated harmonic component is corrected by the harmonics correction unit 5 in accordance with the coefficient preliminarily set with respect to every order of the harmonics so as to execute the correction every order of the harmonics with the coefficient such that the correction amount is made large in accordance with the increasing of the orders of the harmonics. That is, although the detection current I1 detected by the induction coil 1 corresponds to the current I flowing the distribution line 100, the current value to be detected becomes large as the order of the harmonics contained in the current I increases, and according to this fact, the detection error caused between the mutual orders of the harmonics is amended or corrected.

The fundamental component and the harmonic component of the thus corrected detection current are then outputted to the harmonic current content operation unit 6 and the THD operation unit 7. The harmonic current content operation unit 6 operates the current ratio of the corrected harmonic component with respect to the current of the fundamental component as the harmonic current content, which is then outputted to the display unit 8 and the alarm unit 9. Accordingly, since the harmonic current content is calculated in accordance with the current of the corrected harmonic component, the current content is coincident with the ratio of the harmonic component contained in the current I passing the distribution line 100 to be surveyed, thereby making it possible to perform the syrvey with high accuracy.

Further, the THD operation unit 7 serves to operate the THD ratio of the detection current I1 as a ratio of an effective value only of the corrected harmonic component with respect to an effective value of the fundamental component. The thus operated THD is then outputted to the display unit 8 and the alarm unit 9, respectively, and the display and alarm operations are executed through the operation of the control unit 10.

FIG. 3 represents a case of executing the harmonics survey to a limited specific distribution line. With reference to FIG. 3, when the directivity of the induction coil 1 is selected to φ 1 by operating a switch of the control unit 10 with the support rod 201 being contracted so as to provide the extending length d1 from the casing 200, all the distribution lines 101, 102 and 103 are under the conditions to be surveyed, and in this arrangement, the harmonic components contained in the currents passing the distribution lines 101, 102 and 103 are detected as a compound value.

When the directivity of the induction coil 1 is selected to φ 2 by operating the switch of the control unit 10, the distribution lines 101 and 102 are under the conditions to be surveyed, and in this arrangement, the harmonic components contained in the currents passing the distribution lines 101 and 102 are detected as a compound value.

Furthermore, when the support rod 201 is expanded from the above state so as to have the extension d2, only the distribution line 101 is under the condition to be surveyed and only the harmonic component contained in the current passing the distribution line 100 can be detected. Further, in the case where it is required to control the harmonics of respective phase distribution lines 101R, 101S and 101T of this distribution line 100, the surveying operation may be performed by further expanding the support rod 201 or by controlling the switch of the control unit 10 so as to make narrow the directionality.

As described above, according to the arrangement of the harmonics survey system of the second embodiment, the harmonics survey operation can be performed with respect to the distribution line 100 (or 101, 102, 103) to be surveyed selectively in a non-contact manner. Particularly, in the case where a high voltage current flows through the distribution line 100 (or 101, 102, 103), the safeness to the operator can be further ensured. Furthermore, the harmonics of the specified distribution line 100 (or 101, 102, 103) can be surveyed by selecting it from a remote portion by adjusting the expandable length of the support rod 201 and the directivity of the induction coil 1.

The selection of the directivity of the induction coil 1 to φ 1 or φ 2 through the operation of the switch of the control unit 10 is done by adjusting the number of the magnetic fluxes crossing over the induction coil 1 by changing the length, diameter or shape thereof. In one possible example, the induction coil 1 may be composed of two inner and outer coil sections which have different diameters and are overlapped, and the length of the induction coil 1 is changed by moving forward or backward either one of these inner and outer coil sections.

Another Embodiment

The harmonics survey system of another embodiment according to the present invention comprises, commonly to the second embodiment of FIG. 2, the induction coil 1, the current amplifier 2, the A/D converter 3, the fast Fourier transforming unit 4, the harmonic current content operating unit 6, the THD operation unit 7, the display unit 8, the alarm unit 9, the control unit 10 and the directivity adjusting unit 11, and also comprises, in addition thereto, a sensitivity adjusting unit 12, which outputs a detection sensitivity of the detection current detected by the induction coil 1 through the operation of the control unit 10 or the detection current detected by the induction coil 1 to the A/D converter 3 or other succeeding element by adjusting its level.

The harmonics survey system according to this embodiment of the present invention of the arrangement described above will be operated as follows.

As like in the second embodiment, the induction coil 1 is crossed over the magnetic flux of the distribution line 100 to be surveyed, and the detection current I1 caused to the induction coil 1 is amplified to a predetermined value by the current amplifier 2 and the frequency component higher than the predetermined frequency is removed with the anti-aliasing filtering function. Thereafter, the thus amplified current I1 is inputted into the harmonic current content operation unit 6 and the THD operation unit 7 through the A/D converter 3, the fast Fourier transforming unit 4 and the harmonics correction unit 5, thereby operating the harmonic current content and the THD, which are then displayed on the display unit 8 or alarmed through the alarm unit 9.

Under the state mentioned above, when the direction of the induction coil 1 with respect to the distribution line 100 (101, 102, 103) is changed, the magnetic flux crossing over the induction coil 1 changes and the generated detection current I1 also changes. In accordance with such changed detection current I1, the harmonic current content operation unit 6 and the THD operation unit 7 newly operate the harmonic current content and the THD, respectively, which are then displayed on the display unit 8 or alarmed through the alarm unit 9.

The operator operates the control unit 10 in accordance with the display of the display unit 8 or alarm 2 from the alarm unit 9, and then, the sensitivity adjusting unit 12 serves to adjust the detection sensitivity of the detection current detected by the induction coil 1 (or the detection current level detected by the induction coil 1) and then to output it from the sensitivity adjusting unit 12. In the case where the detection sensitivity of the current detected by the induction coil 1 is adjusted, the operation results by the harmonic current content operation unit 6 or the THD operation unit 7 can operates the harmonic current content or the THD, which is then displayed on the display unit 8 or alarmed through the alarm unit 9.

As mentioned above, according to this embodiment, it is possible to easily and accurately specify the generation source of the harmonics in accordance with the harmonic current content ratio or the THD operated in the range in which the direction of the induction coil and the detection sensitivity of the detection current are respectively adjusted by changing the direction of the induction coil and optionally adjusting the detection sensitivity of the detection current by the sensitivity adjusting unit 12 through the induction coil 1.

Furthermore, in the above respective embodiments, although there is adopted the structure in which the fundamental component and the harmonic component of the current detected by the induction coil 1 are calculated by the fast Fourier transforming unit 4, the fundamental component and the harmonic component of the detection current may be separately detected through a filtering treatment using such as band-path filter. In such filtering treatment, in a case where it is not necessary to display numerical values, the A/D converter 3 may be eliminated.

According to the structures and characteristic features of the present invention mentioned above, in general aspect, the induction coil crosses over the magnetic flux caused by the distribution line to be surveyed in harmonics, the fundamental component and the harmonic component of the current detected by the detection means, the content of the harmonic component of the detected harmonics with respect to that of the fundamental component is operated by the harmonic current content operation unit and the thus operated harmonic current content is indicated through the indication means. Accordingly, it is possible to totally judge the existence of the harmonics with the maximum current allowable to the harmonic currents without directly contacting the distribution line to be surveyed and thereby to safely and totally survey the harmonics at every portion of the distribution line.

It is to be noted that the present invention is not limited to the embodiments described above and many other changes and modifications may be done without departing from the scope of the appended claims.

What is claimed is:

1. A harmonics survey system comprising:
   an induction coil means arranged so as to cross over a magnetic flux generated by a current passing through a distribution line and adapted to detect a detection current caused by an electro motive force in proportion to the current passing through the distribution line without physically engaging the distribution line;
   a directivity adjusting unit for changing directivity of said induction coil by varying the amount of magnetic flux generated by the current passing through the distribution line crossing said induction coil;
   a harmonics detection means operatively connected to the induction coil means and adapted to detect a fundamental component and a harmonic component of the detection current detected by the induction coil means;
   means for operating a harmonic current content of the harmonic component with respect to the fundamental component detected by the harmonic detection means; and
   means for indicating the harmonic current content operated by the harmonic current operation means.

2. A harmonics survey system according to claim 1, wherein said harmonics detection means comprises a current amplifier operatively connected to the induction coil means and further comprising an A/D converter connected to the current amplifier for converting analog value representing the amplified current into digital value thereof and a fast Fourier transforming means operatively connected to the A/D converter and adapted to carry our a fast Fourier transforming process to the detected digital current and operate the fundamental component and the harmonic component of the detected current.

3. A harmonics survey system according to claim 1, wherein said indication means comprises at least either one of a display unit and an alarm unit.

4. A harmonics survey system according to claim 1, further comprising means for operating a total harmonic distortion of a current in accordance with the detection currents of the fundamental component and the harmonic component, respectively and wherein said indication means informs the total harmonic distortion of a current operated by the total harmonic distortion of a current operation means.

5. A harmonics survey system according to claim 4, further comprising a detection current correction means disposed between said harmonics detection means and said total current distortion operation means and adapted to correct, in every order of the harmonics, the fundamental component and the harmonic component of the detection current detected by said harmonics detection means and to output the corrected detection current to at least either one of said harmonic current content operation means and said total harmonic distortion of a current operation means.

6. A harmonics survey system according to claim 1, wherein said indication means comprises a display unit visually displaying at least either one of the harmonic current content, numerical values of respective orders of the harmonics to be detected and the total harmonic distortion of a current.

7. A harmonics survey system according to claim 5, further comprising a control means including a switch unit capable of optionally changing over the displayed contents.

8. A harmonics survey system according to claim 1, wherein said induction coil means is disposed to a free end of a support rod having an expandable telescopic structure.

9. A harmonics survey system according to claim 1, wherein said induction coil means includes a sensitivity adjusting unit for adjusting and then outputting a detection sensitivity of the current detected by the induction coil means or a current level thereof.

* * * * *